Figure 1A:
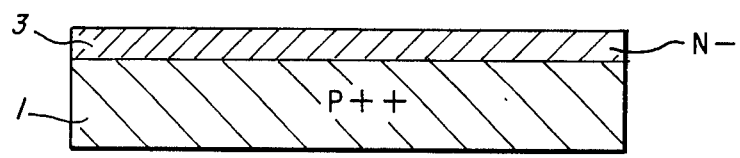

United States Patent [19]

Smeltzer et al.

[11] 4,050,979

[45] Sept. 27, 1977

[54] PROCESS FOR THINNING SILICON WITH SPECIAL APPLICATION TO PRODUCING SILICON ON INSULATOR

[75] Inventors: Ronald K. Smeltzer, Dallas; Kenneth E. Bean, Richardson, both of Tex.

[73] Assignee: Texas Instruments Incorporated, Dallas, Tex.

[21] Appl. No.: 649,130

[22] Filed: Jan. 14, 1976

Related U.S. Application Data

[62] Division of Ser. No. 429,228, Dec. 28, 1973, abandoned.

[51] Int. Cl.² .......................................... H01L 21/306
[52] U.S. Cl. ........................................ 156/647; 29/580; 156/657; 156/662; 252/79.3; 427/86; 427/93
[58] Field of Search .................. 156/17, 7, 3, 647, 662, 156/657; 252/79.3; 427/82, 93, 86; 29/580

[56] References Cited

U.S. PATENT DOCUMENTS

| | | | |
|---|---|---|---|
| 3,096,262 | 7/1963 | Shockley | 156/3 |
| 3,390,022 | 6/1968 | Fa | 29/580 |
| 3,486,892 | 12/1969 | Rosvold | 156/17 |
| 3,721,588 | 3/1973 | Hays | 156/17 |
| 3,767,494 | 10/1973 | Muraoka et al. | 156/17 |

*Primary Examiner*—Charles E. Van Horn
*Assistant Examiner*—J. J. Gallagher
*Attorney, Agent, or Firm*—Harold Levine; James T. Comfort; Gary C. Honeycutt

[57] ABSTRACT

This disclosure relates to methods of producing thin layers of silicon as well as thin layers of silicon on insulating substrates such as silicon dioxide or polycrystalline silicon by forming either an n− layer of single crystal silicon over a p++ layer of single crystal silicon or a p− layer of single crystal silicon over an n++ layer of single crystal silicon and then removing either the n++ or p++ single crystal substrate, as the case may be, by utilizing an etch which will only etch the n++ or p++ region and will stop when the n− or p− region, as the case may be, has been reached.

9 Claims, 10 Drawing Figures

PROCESS FOR THINNING SILICON WITH SPECIAL APPLICATION TO PRODUCING SILICON ON INSULATOR

This is a division of application Ser. No. 429,228, filed Dec. 28, 1973, now abandoned.

This invention relates to methods of producing thin layers of silicon as well as to methods of producing thin layers of silicon on a substrate of material and, more specifically, to a method of producing such thin layers of silicon over an insulating substrate, such as a polycrystalline substrate, or an insulated substrate such as an oxide-coated semiconductor.

It has been known in the prior art that it is desirable to produce thin layers of silicon upon a dielectric substrate to provide good electrical isolation between electrical components on the substrate as well as for other desirable reasons. This has been accomplished in accordance with the prior art by the well-known silicon on sapphire method wherein silicon is deposited on a sapphire substrate. Devices of this type suffer from the loss in quality caused by the difference in the crystallographic structure between silicon and sapphire. In addition, this method has been expensive due to the high cost of a sapphire substrate. The above has also been accomplished in the prior art by growing a thin epitaxial silicon layer on a single crystal silicon substrate and then forming oxide and polycrystalline silicon over the epitaxial layer with subsequent grinding away of the original substrate. This method has found problems in that it is difficult to obtain a clean undamaged surface on the thin layer of deposited silicon after the grinding operations due to the damage caused by grinding.

In accordance with the present invention, there are provided methods for producing thin layers of silicon on a dielectric or insulating substrate, the silicon layer having the characteristics of high quality silicon and therefore being superior to the silicon on sapphire and also providing a final thin layer of silicon which has a relatively undamaged surface and upon which further operations can be performed for formation of semiconductor devices.

Briefly, the above is accomplished in accordance with the first embodiment, a thin n− epitaxial layer is deposited over a p++ substrate. A silicon oxide coating is then formed over the n− layer and polycrystalline silicon is then grown over the oxide layer. The p++ layer is then removed by use of an etchant which will only etch the p++ layer and stop when the junction between the p++ and n− layers is reached. At this point, semiconductor devices can be formed in the n− layer using any of the well-known methods of fabrication, and, in addition, a further silicon oxide layer can be formed over the n− layer or any layers that have been deposited over the n− layer in prior fabrication steps. Holes are opened in the silicon oxide which are tuned so that a following orientation dependent etch (ODE) will provide etching down to the junction of the n− layer with the silicon dioxide therebelow. A further silicon oxide deposition in the newly etched region will provide electrical isolation.

In accordance with the second embodiment of the invention, a thin n− epitaxial layer is deposited on a p++ substrate having a {100} crystallographic orientation. Silicon oxide is then formed over the epitaxial layer and openings are made in the oxide which are tuned in size so that a following orientation dependent etch will provide etching down to or slightly above the junction of the n− layer and p++ layer. A further layer of silicon oxide is then formed in the etched grooves and polycrystalline silicon is then formed over the entire silicon oxide layer. The p++ region is then etched away by utilizing an etch which will only remove the p++ layer and will stop at the junction therewith and the n− layer. At this point, N− regions are provided which are electrically isolated from other n− regions by means of the dielectric isolation of the silicon oxide. Semiconductor devices can now be formed in the n− regions in standard well-known manner.

It is therefore an object of this invention to provide an etching method whereby an etch stop is provided by utilizing adjacent layers, one of low resistivity and the other having a resistivity above a predetermined value whereby etching takes place in the low resistivity region and stops upon reaching the high resistivity region, the two regions being of opposite conductivity type.

It is a further object of this invention, to provide a method of producing a thin layer of silicon on a dielectric substrate by utilizing a starting substrate of low resistivity and depositing thereon a layer of opposite conductivity type having resistivity above a predetermined value thus providing a compensated intrinsic interface layer and a built-in electric field each of which enhances the abruptness of the etch stop. After formation of an oxide and polycrystalline silicon over the high resistivity layer, the original substrate is removed by means of a concentration dependent etching solution.

It is a still further object of this invention to provide an etch stop at a junction of two semiconductor layers wherein one layer is of one conductivity type and the other layer is of opposite conductivity type and of higher resistivity than said first layer an also having a resistivity above a predetermined value.

The above objects and still further objects of this invention will immediately become apparent to those skilled in the art after consideration of the foll wing preferred embodiments thereof, which are provided by way of example and not be way of limitation, wherein:

FIGS. 1A–1F describe a series of steps for providing a thin layer of silicon on a dielectric substrate with subsequent formation of electrical devices therein according to a first embodiment of the present invention; and FIGS. 2A–2D set forth a second method of producing thin layers of silicon on a dielectric substrate with subsequent formation of semiconductor devices on or in the substrate.

Referring now to FIGS. 1A, there is shown a starting p++ substrate 1 having an epitaxially deposited n− region 3 thereon. It should be understood that although the preferred embodiments are described with respect to p++ and n− layers, the invention will work equally well by starting with an n++ region and a p− epitaxially grown layer thereon. It should also be noted that the layer 3 need not be deposited by chemical vapor deposition but can be formed in any well-known manner. The p++ region 1 is preferably 10 to 12 mils in thickness, though it should be understood that any thickness can be used, the thickness being held as small as possible so that a later etching step will be required to etch away a minimum amount of the silicon. The region 1 has a resistivity which is preferably less than 0.01 ohms cm. and preferably in the region of 0.005 to 0.007 ohm cm. For example, the n− epitaxial layer 3 is about 1 mil in thickness and has a resistivity of at least 0.1 ohm cm. The resistivity of the region 3 is at least an order of magnitude greater than the region 1. The resistivity of the region 3 is critical since it must act as an etch stop as will be explained in greater detail hereinbelow. It is therefore necessary that the region 3 have less than about $1.5 \times 10^{19}$ atoms per cubic cm. if it is $p$ type and less than about $7 \times 10^{18}$ per atoms per cubic cm. if it is $n$ type.

Figure 1B:
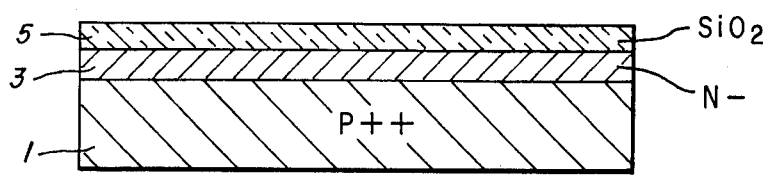
Figure 1C:
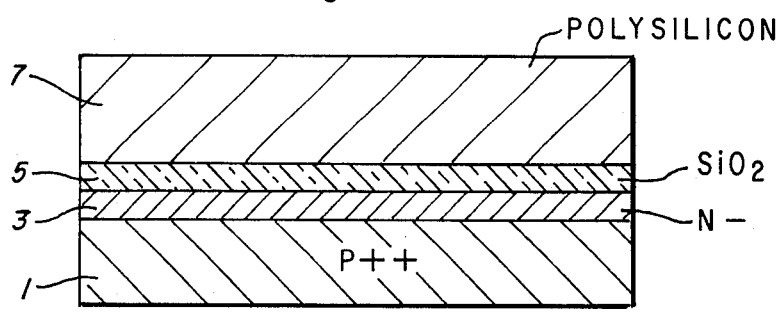

A silicon dioxide layer 5 is then formed over the layer 3 as shown in FIG. 1B and polycrystalline layer 7 is then formed over the silicon dioxide layer 5, as shown in FIG. 1C. The region 1 is then etched away by utilizing an etchant which preferably has, by weight, hydrofluoric acid, 1 part, 3 parts nitric acid and from 8 to 12 parts acetic acid. The region 1 can be etched completely away by means of the etchant, the etching operation stopping automatically when it reaches the junction between the regions 1 and 3. An alternative step is to mechanically grind or otherwise remove the region 1 away, up to about 3 mils from the junction of the regions 1 and 3, with the remainder of region 1 being removed by means of the above described etching solution. The grinding must stop at about 3 mils from the junction of the regions 1 and 3 because grinding causes damage in the region from about 1 to 3 mils ahead of the grinding region. The structure resulting after the etching step is shown in FIG. 1D.

At this point, there are several directions in which fabrication can proceed. As seen in FIG. 1D, semiconductor devices 9 are shown fabricated in the n− surface, this being accomplished by a normal masking and diffusion step, two such operations being necessary to form a transistor, it being understood that other types of devices can also be formed in this manner. The semiconductor devices are then electrically isolated by forming a silicon dioxide layer or other appropriate layer 11 on the surface of the layer 3 and then forming holes in the layer 11 which are tuned to the thickness of the layer 3 whereby an orientation dependent etch which then takes place will cause a groove 13 to be formed which extends down to the junction of the layer layers 3 and 5, thereby isolating adjacent semiconductor devices formed in the layer 3, as shown in FIG. 1E. A further silicon oxide layer 15 is then formed in the grooves 13 to provide additional isolation between electrical components as shown in FIG. 1F. Appropriate contacts are then made by standard processing steps to provide complete devices.

Figure 1D:
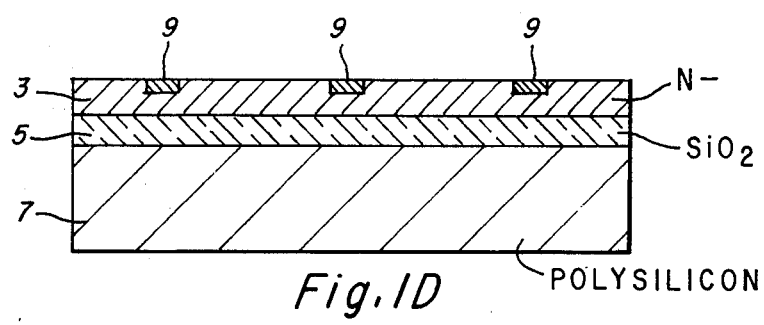
Figure 1E:
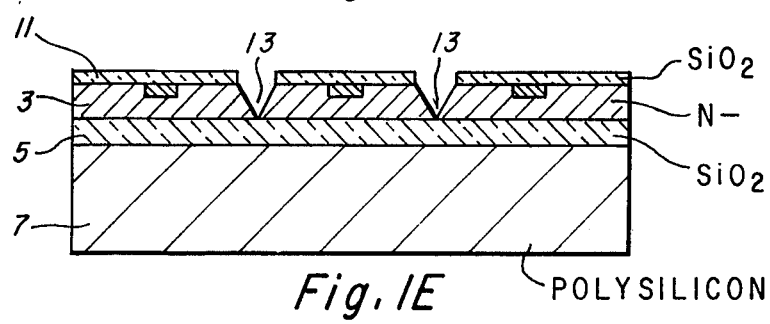
Figure 1F:
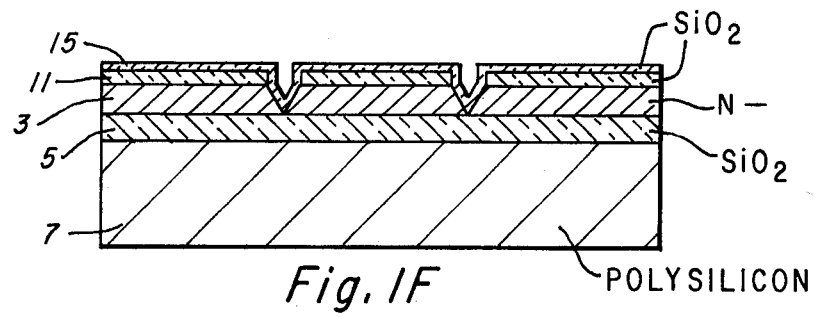

It is apparent from the structure shown in FIG. 1D that the grooves 13 could be formed prior to formation of the semiconductor devices 9 with subsequent removal of the oxide layer 11, deposition of oxide into the grooves formed by the ODE etch and then formation of the semiconductor devices. It should also be understood that the substrate 1 can have substantially any crystallographic orientation. For example, in the event the orientation dependent etch is to be used, region 1 may be of {100} crystallographic orientation in order to obtain triangular grooves 13. Rectangular grooves can be formed by use of {110} crystallographic orientation.

Figure 2A:
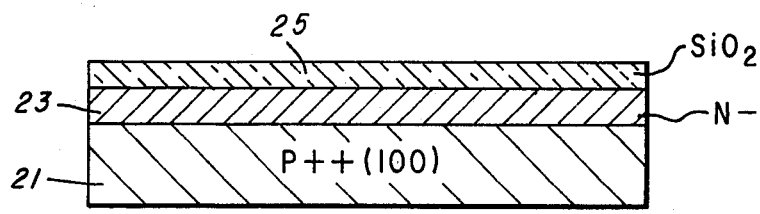
Figure 2B:
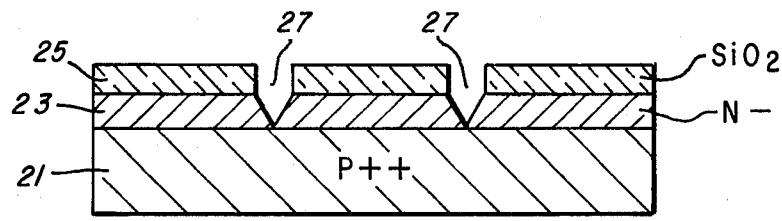
Figure 2C:
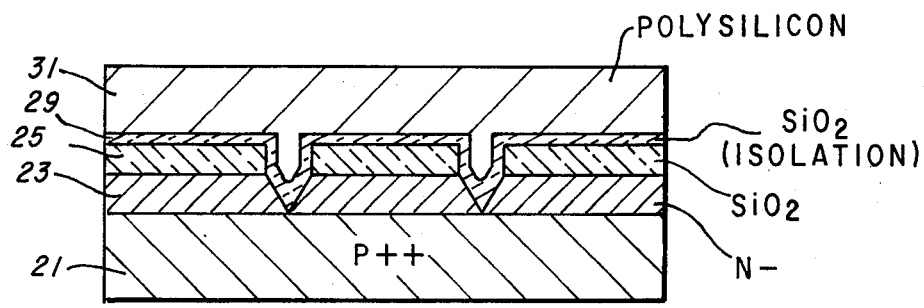
Figure 2D:
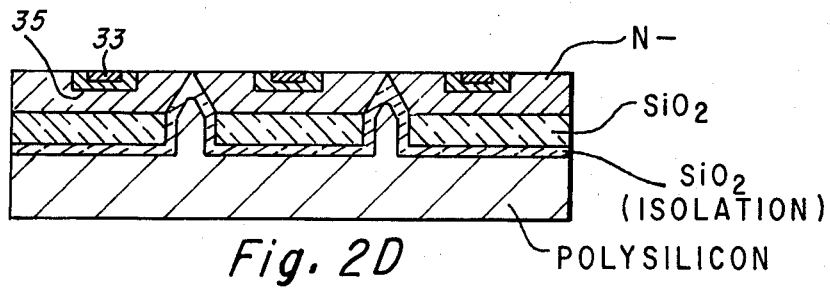

Referring now to FIGS. 2A - 2D, there is shown a second embodiment of the present invention. In accordance with the second embodiment, a starting substrate of p++ material 21 having {100} crystallographic orientation is provided and an epitaxial layer of n− material 23 is formed thereon. A silicon dioxide layer 25 is then formed over the layer 23. Holes are then opened in the layer 25 which are tuned to the thickness of the layer 23 so that a subsequent orientation dependent etch will stop either at the junction between the layers 21 and 23 or slightly above the junction. In the event the etching stops slightly above the junction, in a later operation step, it would be necessary to remove a slight amount of the layer 23 by polishing or the like down to the point where the etching stops. The orientation dependent etch therefore forms the grooves 27 as shown in FIGS. 2B. A further layer of silicon dioxide 29 is formed over the upper surface of the structure of FIG. 2B and deposits into the grooves 27 as shown in FIG. 2C. A polycrystalline silicon layer 31 is then formed over the layer 29, again as shown in FIG. 2C. The layer 29 provides electrical isolation in the same manner as described earlier in regard to the embodiment of FIG. 1. The region 21 is now etched away using the same etchant as described hereinabove with regard to the embodiment of FIG. 1 and in the same manner. This will then provide a plurality of electrically isolated regions in the layer 23 as shown in FIG. 2D. Semiconductor devices such as transistors having emitter regions 33 and base regions 35 as shown in FIG. 2D can now be formed by the normal masking and deposition steps, which are well-known in the art and not described in detail in the procedure herein.

It is apparent that contacts will have to be provided to the various regions of the semiconductor devices formed in both the embodiments of FIGS. 1 and 2 to provide complete and useable semiconductor devices.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of forming thin layers of silicon on an insulating substrate which comprises the steps of
   a. providing a silicon member having a first layer of one conductivity type and a second layer of opposite conductivity type and having a resistivity of at least an order of magnitude greater than said first layer and a concentration of less than about $1.5 \times 10^{19}$ atoms/cc, and
   b. forming a first oxide layer on said second layer,
   c. forming a layer of polycrystalline silicon on said first oxide layer,
   d. etching said first layer with an etching solution consisting of, by weight, 1 part HF, 3 parts $NHO_3$ and from about 8 to about 12 parts $CH_3COOH$ to provide etching away of said first layer, said etching automatically stopping at the junction of said first and second layer, and
   e. forming semiconductor devices in the exposed surface of said second layer.

2. A method as set forth in claim 1, wherein said first layer is N type and said second layer is P type.

3. A method as set forth in claim 1, wherein said first layer has a resistivity of about 0.4 ohm-centimeters and said second layer has a resistivity of about 0.005 to about 0.007 ohm-centimeters.

4. A method as set forth in claim 2, wherein said first layer has a resistivity of about 0.4 ohm-centimeters and said second layer has a resistivity of about 0.005 to about 0.007 ohm-centimeters.

5. A method as in claim 1, wherein said formation of semiconductor devices is followed by the steps of:
   forming an insulation layer covering said devices;
   selectively etching crystallographically oriented grooves extending through said second layer to provide electrical isolation between adjacent semiconductor devices; and then
   forming an additional insulation layer in said grooves.

6. A method of forming thin layers of silicon on an insulating substrate which comprises the steps of
   a. providing a silicon member having a first layer of one conductivity type and a second layer of opposite conductivity type and having a resistivity of at least an order of magnitude greater than said first layer and a concentration of less than about $7 \times 10^{18}$ atoms/cc, and
   b. forming a first oxide layer over said second layer,
   c. forming a layer of polycrystalline silicon over said first oxide layer,
   d. etching said first layer with an etching solution consisting of, by weight, 1 part HF, 3 parts $HNO_3$ and from about 8 to about 12 parts $CH_3COOH$ to provide etching away of said first layer, said etching automatically stopping at the junction of said first and second layer.

7. A method as set forth in claim 6, wherein said first layer is P type and said second layer is N type.

8. A method as set forth in claim 6, wherein said first layer has a resistivity of about 0.4 ohm-centimeters and said second layer has a resistivity of about 0.005 to about 0.007 ohm-centimeters.

9. A method as set forth in claim 7, wherein said first layer has a resistivity of about 0.4 ohm-centimeters and said second layer has a resistivity of about 0.005 to about 0.007 ohm-centimeters.

* * * * *